(12) United States Patent
Akiyama et al.

(10) Patent No.: US 10,115,798 B2
(45) Date of Patent: Oct. 30, 2018

(54) SEMICONDUCTOR DEVICE AND METHOD OF MANUFACTURING THE SAME (71) Applicant: TOYOTA JIDOSHA KABUSHIKI KAISHA, Toyota-shi, Aichi (JP)

(72) Inventors: Naoki Akiyama, Nisshin (JP); Hiroki Tsuma, Okazaki (JP); Takashi Kuno, Kariya (JP); Toshitaka Kanemaru, Kariya (JP); Kenta Hashimoto, Kariya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/883,571

(22) Filed: Jan. 30, 2018

(65) Prior Publication Data

US 2018/0233571 A1    Aug. 16, 2018

(30) Foreign Application Priority Data

Feb. 15, 2017  (JP) ................................. 2017-026161

(51) Int. Cl.
*H01L 29/45* (2006.01)
*H01L 23/488* (2006.01)
(Continued)

(52) U.S. Cl.
CPC ............ *H01L 29/45* (2013.01); *H01L 21/283* (2013.01); *H01L 23/562* (2013.01); *H01L 24/42* (2013.01);
(Continued)

(58) Field of Classification Search
CPC ... H01L 24/42; H01L 21/283; H01L 29/4236; H01L 29/45; H01L 24/45; H01L 24/44;
(Continued)

(56) References Cited

U.S. PATENT DOCUMENTS 4,987,562 A * 1/1991 Watanabe ......... H01L 23/53223
                                                         257/742
5,587,336 A * 12/1996 Wang ..................... H01L 24/11
                                                         257/E21.508
(Continued)

FOREIGN PATENT DOCUMENTS

DE   102004043523 A1 *  5/2005   ......... H01L 23/4334
JP   2011-249491 A      12/2011
(Continued)

*Primary Examiner* — Earl Taylor
(74) *Attorney, Agent, or Firm* — Oliff PLC (57) ABSTRACT

A semiconductor device is provided with: a semiconductor substrate; a first electrode disposed on a surface of the semiconductor device and configured to be soldered to a conductive member; and a second electrode disposed on the surface of the semiconductor device and configured to be wire-bonded to a conductive member. The first electrode includes first, second and third metal layers. The second metal layer is located between the first and third metal layers. A metallic material of the second metal layer is greater in tensile strength than a metallic material of each one of the first metal layer and the third metal layer. The second electrode includes a layer made of a same metallic material as one of the first metal layer and the third metal layer, and does not include any layers made of a same metallic material as the second metal layer.

6 Claims, 9 Drawing Sheets

(51) Int. Cl.
*H01L 29/423* (2006.01)
*H01L 23/00* (2006.01)
*H01L 21/283* (2006.01)

(52) U.S. Cl.
CPC .. *H01L 29/4236* (2013.01); *H01L 2924/3512* (2013.01)

(58) Field of Classification Search
CPC ......... H01L 24/30; H01L 24/33; H01L 24/47; H01L 24/31; H01L 24/28; H01L 24/49; H01L 2924/3512
See application file for complete search history.

(56) References Cited

U.S. PATENT DOCUMENTS

| | | | | |
|---|---|---|---|---|
| 6,166,433 A * | 12/2000 | Takashima | H01L 21/563 | 257/693 |
| 6,444,498 B1 * | 9/2002 | Huang | H01L 21/561 | 257/706 |
| 6,458,626 B1 * | 10/2002 | Huang | H01L 23/3128 | 257/E23.092 |
| 6,593,222 B2 * | 7/2003 | Smoak | H01L 24/03 | 257/E23.02 |
| 6,703,707 B1 * | 3/2004 | Mamitsu | H01L 23/051 | 257/718 |
| 6,734,552 B2 * | 5/2004 | Combs | H01L 23/4334 | 257/707 |
| 6,960,831 B2 * | 11/2005 | Burrell | H01L 24/05 | 257/751 |
| 7,015,072 B2 * | 3/2006 | Combs | H01L 21/4871 | 257/707 |
| 7,196,403 B2 * | 3/2007 | Karim | H01L 23/4334 | 257/276 |
| 7,239,016 B2 * | 7/2007 | Hirano | H01L 23/4334 | 257/712 |
| 7,323,769 B2 * | 1/2008 | Tan | H01L 23/3107 | 257/666 |
| 7,361,995 B2 * | 4/2008 | Goh | H01L 23/04 | 257/778 |
| 7,508,066 B2 * | 3/2009 | Huang | H01L 21/4871 | 174/252 |
| 7,741,714 B2 * | 6/2010 | Huang | H01L 24/05 | 257/754 |
| 7,975,377 B2 * | 7/2011 | Kwon | H01L 23/4334 | 174/261 |
| 8,558,229 B2 * | 10/2013 | Jeng | H01L 24/11 | 257/48 |
| 8,704,341 B2 * | 4/2014 | Lin | H01L 23/49805 | 257/659 |
| 9,768,287 B1 * | 9/2017 | Soeno | H01L 23/5283 | |
| 9,865,728 B2 * | 1/2018 | Soeno | H01L 29/0619 | |
| 9,966,460 B2 * | 5/2018 | Soeno | H01L 23/5283 | |
| 2002/0000671 A1 * | 1/2002 | Zuniga | H01L 24/03 | 257/773 |
| 2003/0045088 A1 * | 3/2003 | Imai | H01L 21/76838 | 438/622 |
| 2004/0171246 A1 * | 9/2004 | Akram | H01L 23/53238 | 438/612 |
| 2004/0224491 A1 * | 11/2004 | Datta | H01L 24/03 | 438/613 |
| 2005/0006778 A1 * | 1/2005 | Shinyama | H01L 23/4334 | 257/765 |
| 2005/0067708 A1 * | 3/2005 | Burrell | H01L 24/05 | 257/762 |
| 2005/0077617 A1 * | 4/2005 | Hirano | H01L 23/4334 | 257/712 |
| 2006/0081996 A1 * | 4/2006 | Shinyama | H01L 23/051 | 257/773 |
| 2006/0091536 A1 * | 5/2006 | Huang | H01L 24/05 | 257/734 |
| 2007/0158858 A1 * | 7/2007 | Hwang | H01L 25/18 | 257/784 |
| 2008/0224326 A1 * | 9/2008 | Kuo | H01L 22/32 | 257/780 |
| 2009/0236742 A1 * | 9/2009 | Low | H01L 24/05 | 257/737 |
| 2010/0263849 A1 * | 10/2010 | Nakano | B23K 35/262 | 165/185 |
| 2010/0276817 A1 * | 11/2010 | Senoo | H01L 24/85 | 257/784 |
| 2011/0256668 A1 * | 10/2011 | Urano | H01L 21/6836 | 438/114 |
| 2011/0298048 A1 * | 12/2011 | Senoo | H01L 24/03 | 257/335 |
| 2012/0199977 A1 * | 8/2012 | Yamamoto | H01L 24/05 | 257/762 |
| 2012/0248618 A1 * | 10/2012 | Akino | H01L 24/05 | 257/773 |
| 2014/0213019 A1 * | 7/2014 | Onishi | H01L 29/407 | 438/118 |
| 2016/0027648 A1 * | 1/2016 | Urano | H01L 23/36 | 438/106 |
| 2016/0064308 A1 * | 3/2016 | Yamada | H01L 23/142 | 257/697 |
| 2017/0025521 A1 * | 1/2017 | Nakagawa | H01L 29/7397 | |
| 2017/0243964 A1 * | 8/2017 | Sato | H01L 23/367 | |
| 2017/0263738 A1 * | 9/2017 | Soeno | H01L 23/5283 | |
| 2017/0263739 A1 * | 9/2017 | Soeno | H01L 23/5283 | |
| 2017/0263754 A1 * | 9/2017 | Soeno | H01L 29/0619 | |

FOREIGN PATENT DOCUMENTS

| | | | | |
|---|---|---|---|---|
| JP | 2012-164825 A | | 8/2012 | |
| JP | 2012-216772 A | | 11/2012 | |
| JP | 2014179541 A | * | 9/2014 | ............ H01L 21/50 |
| JP | 2015-002234 A | | 1/2015 | |
| JP | 2015-144168 A | | 8/2015 | |

* cited by examiner

SEMICONDUCTOR DEVICE AND METHOD OF MANUFACTURING THE SAME

TECHNICAL FIELD

The technique disclosed herein relates to a semiconductor device and a method of manufacturing the same.

BACKGROUND

Japanese Patent Application Publication No. 2011-249491 describes a semiconductor device. This semiconductor device includes a semiconductor substrate, and an electrode provided on a surface of the semiconductor substrate. The electrode includes a first metal layer, a second metal layer, and a third metal layer. The second metal layer is an intermediate layer located between the first and third metal layers, and a metallic material of the second metal layer is greater in tensile strength than a metallic material of each of the first and third metal layers. Due to this, the second metal layer is called a high-strength metal film.

SUMMARY

According to the aforementioned electrode structure, failure of the semiconductor device can be prevented due to the increased strength of the electrode. For example, in an electrode of a semiconductor device, a crack may occur in the electrode due to a localized high stress caused by thermal expansion of the semiconductor device. At a stage where only a minor crack has occurred in the electrode, performance of the semiconductor device is hardly affected, However, when this crack grows larger and reaches a semiconductor substrate, semiconductor elements provided within the semiconductor substrate may thereby be damaged, and a serious problem may occur in the performance and operation of the semiconductor device. In this regard, if the electrode is provided with a high-strength intermediate layer, the growth of the crack in the electrode can be suppressed, and the crack can be avoided reaching the semiconductor substrate.

On the other hand, it has been found that, when the electrode provided with the high-strength intermediate layer is wire-bonded, a crack may occur in the high-strength intermediate layer due to pressure and ultrasonic vibration to which the electrode is subjected. When such a crack occurs in the high-strength intermediate layer, a crack reaching the semiconductor substrate may be generated with the aforementioned crack as a starting point. That is, in an electrode to be wire-bonded, the presence of the high-strength intermediate layer can rather be a factor that causes failure of the semiconductor device. As such, the electrode structure provided with the high-strength intermediate layer can be a measure for preventing semiconductor device failure, while at the same time, it can also be a factor causing the semiconductor device failure.

Thus, the disclosure herein provides a technique that suitably employs a high-strength intermediate layer for an electrode of a semiconductor device.

According to an aspect of this technique, a semiconductor device is hereby disclosed. This semiconductor device may comprise a semiconductor substrate; a first electrode disposed on a surface of the semiconductor device and configured to be soldered to a conductive member; and a second electrode disposed on the surface of the semiconductor device and configured to be wire-bonded to a conductive member. The first electrode may comprise a first metal layer, a second metal layer, and a third metal layer, and the second metal layer may be located between the first metal layer and the third metal layer. Further, a metallic material of the second metal layer may be greater in tensile strength than a metallic material of each one of the first metal layer and the third metal layer. Further, the second electrode may comprise a layer constituted of a same metallic material as one of the first metal layer and the third metal layer, and does not comprise any layers constituted of a same metallic material as the second metal layer.

The aforementioned semiconductor device is provided with the first electrode to which the conductive member is to be soldered, and the second electrode to which another conductive member is to be wire-bonded. The first electrode, which is to be soldered, includes the high-strength second metal layer as its intermediate layer, whereas the second electrode, which is to be wire-bonded, does not include any high-strength intermediate layer such as the second metal layer. According to such a configuration, growth of a crack caused, for example, by thermal stress is suppressed in the first electrode by the presence of the high-strength second metal layer. Meanwhile, occurrence of a crack caused by wire bonding is suppressed in the second electrode by the absence of the high-strength intermediate layer. As above, in the semiconductor device disclosed herein, the electrode structure including the high-strength intermediate layer is selectively employed to a plurality of electrodes, as a result of which semiconductor device failure is effectively suppressed.

According to another aspect of the technique disclosed herein, a method of manufacturing a semiconductor device is disclosed. The semiconductor device manufactured by this method may comprise: a semiconductor substrate; a first electrode disposed on a surface of the semiconductor device and configured to be soldered to a conductive member; and a second electrode disposed on the surface of the semiconductor device and configured to be wire-bonded to a conductive member. The method may comprise forming a first metal film on the surface of the semiconductor substrate. The first metal film may be formed both on a first area where the first electrode is to be formed and on a second area where the second electrode is to be formed. The method may further comprise forming a second metal film on a surface of the first metal film, The second metal film may be formed both in the first area and in the second area, and a metallic material of the second metal film is greater in tensile strength than a metallic material of the first metal film. The method may farther comprise removing a portion of the second metal film located within the second area, and forming a third metal film on a surface of the second metal film. The third metal film may be formed both in the first area and in the second area, and the third metal film may be formed directly on the surface of the first metal film in the second area. A metallic material of the third metal film may be lower in tensile strength than the metallic material of the second metal film.

According to the aforementioned manufacturing method, the first electrode which includes the high-strength second metal layer as its intermediate layer, and the second electrode which does not include any high-strength intermediate layer such as the second metal layer can both be formed simultaneously on the surface of the semiconductor substrate. Due to this, a semiconductor device which is unlikely to fail as aforementioned can relatively easily be manufactured.

BRIEF DESCRIPTION OF DRAWINGS

FIG. 6 shows a comparative example of FIG. 5, and it shows how a crack occurs in an intermediate layer 44a by wire bonding when the signal electrode 16 includes the high-strength mediate layer 44a.

DETAILED DESCRIPTION

In an embodiment of the technique disclosed herein, a semiconductor substrate may include an element region in which at least one semiconductor element is provided and a peripheral region located around the element region. In this case, a first electrode is preferably located on the element region and a second electrode is preferably located on the peripheral region. High stress tends to occur in the first electrode located on the element region accompanying thermal expansion of a semiconductor device, and a risk of crack generation caused thereby is also high. In this regard, when the first electrode is provided with a high-strength second metal layer, crack growth is suppressed even if such a crack occurs in the first electrode. Due to this, semiconductor device failure can be suppressed.

In an embodiment of the technique disclosed herein, the second electrode may be constituted only of a same metallic material as a first metal layer and a third metal layer, and may not include any intermediate layers constituted of other metallic material. This is because, if the second electrode is provided with a layer constituted of such other metallic material, there is a risk of crack generation in this layer when wire bonding is performed.

In an embodiment of the technique disclosed herein, the first metal layer and the third metal layer may be constituted of the same metallic material as each other. In this case, although not particularly limited, the metallic material of the first metal layer and the third metal layer may be aluminum or aluminum alloy (for example, Al—Si alloy). Alternatively, as another embodiment, the metallic materials of the first metal layer and the third metal layer may be metallic materials that are different from each other.

In an embodiment of the technique disclosed herein, the second metal layer may be constituted of titanium nitride (TiN). Titanium nitride is one type of metallic materials having sufficient tensile strength to suppress the crack growth. The material of the second metal layer is not limited to titanium nitride, and for example, it may be other metallic material such as titanium (Ti), tungsten (W), molybdenum (Mo), or an alloy containing at least one of the aforementioned elements.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor device, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

A semiconductor device 10 of an embodiment and a manufacturing method thereof will be described with reference to the drawings. The semiconductor device 10 of the embodiment is a power semiconductor device used in a power supply circuit, and includes an IGBT (Insulated Gate Bipolar Transistor) structure, which will be described later. Although not particularly limited, the semiconductor device 10 can be used as a switching element for a power converter circuit, such as a converter or an inverter, in an electrically-driven vehicle, such as a hybrid vehicle, a fuel cell vehicle, or an electric vehicle. Hereinbelow, a structure of the semiconductor device 10 will be described first, and then a manufacturing method of the semiconductor device 10 will be described. It should however be noted that the semiconductor device 10 and the manufacturing method thereof to be described below are mere examples, and the technical elements disclosed herein can be applied to various types of other semiconductor devices and their manufacturing methods, individually or in combinations.

Figure 1:
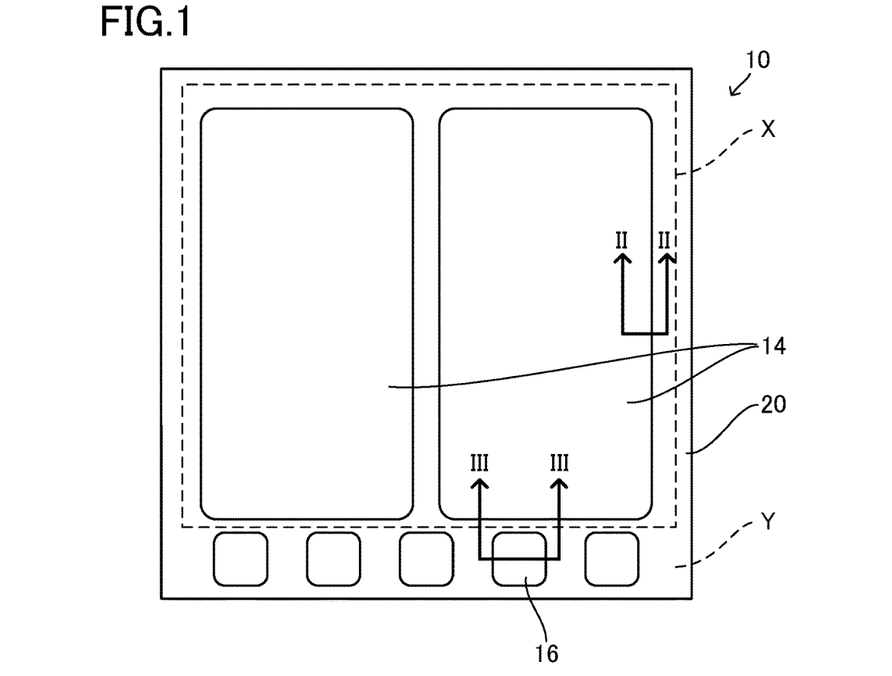
FIG. 1 is a plan view of a semiconductor device 10 of an embodiment.
Figure 2:
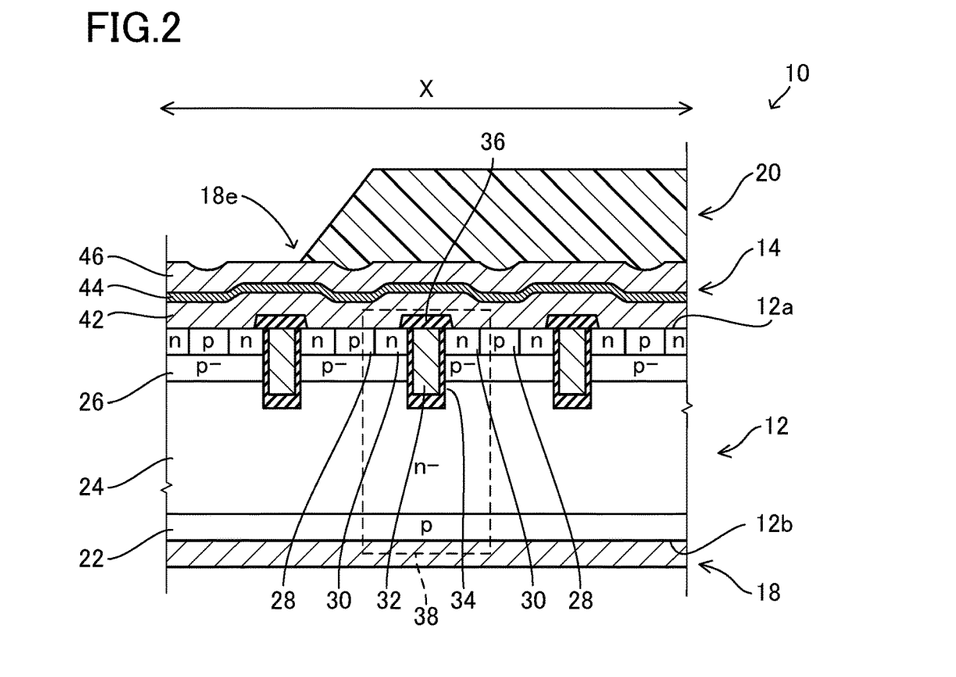
FIG. 2 is a cross-sectional view along a line II-II in FIG. 1.
Figure 3:
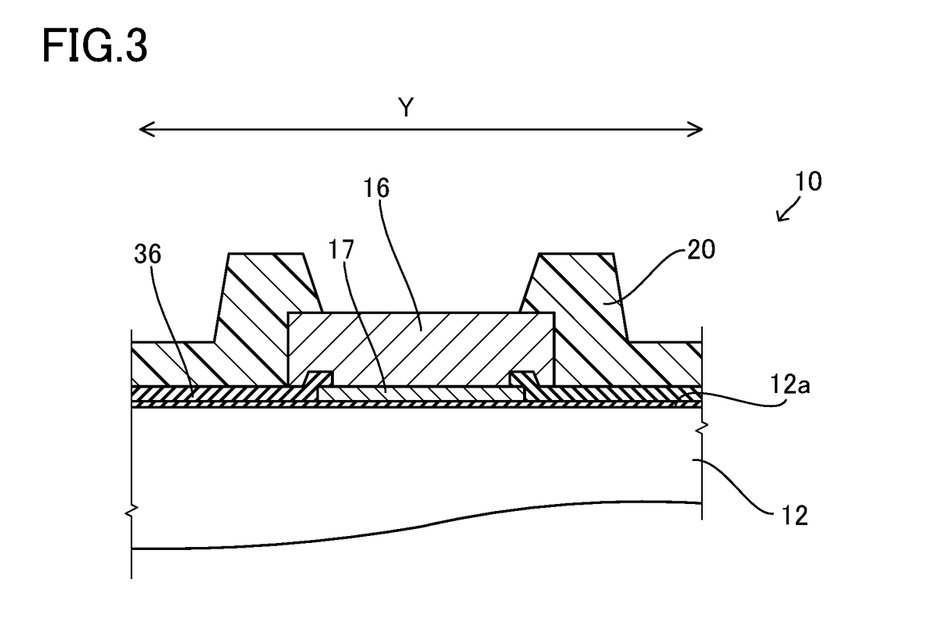
FIG. 3 is a cross-sectional view along a line III-III in FIG. 1.

As shown in FIGS. 1 to 3, the semiconductor device 10 includes a semiconductor substrate 12. The semiconductor substrate 12 includes an element region X, and a peripheral region Y located around the element region X. The element region X has a plurality of semiconductor elements 38 provided therein. Although this is merely an example, each of the semiconductor elements 38 in the present embodiment includes an IGBT structure, and includes a p-type collector region 22, an n-type drift region 24, a p-type body region 26, p-type body contact regions 28, and n-type emitter regions 30. Further, each of the semiconductor elements 38 includes a gate electrode 32. The gate electrodes 32 are located within trenches provided in an upper surface 12a of the semiconductor substrate 12, and they face their corresponding emitter regions 30 and the body region 26 via corresponding gate insulating films 34. The gate electrodes 32 are covered by interlayer insulating films 36 at the upper surface 12a of the semiconductor substrate 12. Such an IGBT structure is well known, and it can suitably be modified. Further, a material of the semiconductor substrate 12 may be any of various semiconductor materials, and although not particularly limited, it may for example be silicon (Si), silicon carbide (SiC), or gallium nitride (GaN).

Here, the structure of the semiconductor elements 38 may not be limited to IGBT, but may be another type of semiconductor element. For example, the structure of the semiconductor elements 38 may be other switching element such as a MOSFET (Metal-Oxide-Semiconductor Field Effect Transistor), or a diode. Alternatively the structure of the semiconductor elements 38 may be a reverse-conduction IGBT (RC-IGBT) including both an IGBT and a diode.

Upper main electrodes 14 and a plurality of signal electrodes 16 are provided on the upper surface 12a of the semiconductor substrate 12. Further, a lower main electrode 18 is provided on a lower surface 12b of the semiconductor substrate 12. These electrodes 14, 16, 18 are electric connection terminals of the semiconductor device 10, and are constituted of conductive members. The semiconductor device 10 is electrically connected to external circuit(s) using these electrodes 14, 16, 18.

As shown in FIGS. 1 and 2, the upper main electrodes 14 are located on the element region X, and are electrically connected to the plurality of semiconductor elements 38. That is, the upper main electrodes 14 are connection terminals for a power supply circuit. The upper main electrodes 14 is an example of a first electrode disclosed herein, and are designed to be soldered to conductive members such as leads. Each upper main electrode 14 includes a first metal layer 42, a second metal layer 44, and a third metal layer 46.

The first metal layer 42 is directly in contact with the upper surface 12a of the semiconductor substrate 12, and makes ohmic contact with the body contact region 28 and the emitter regions 30. On the other hand, the first metal layer 42 is insulated from the gate electrodes 32 by the interlayer insulating films 36. A metallic material of the first metal layer 42 is Al—Si alloy (alloy of aluminum and silicon). The metallic material of the first metal layer 42 is not limited to Al—Si alloy, but may be aluminum or other type of aluminum alloy. Alternatively, the metallic material of the first metal layer 42 may be a metallic material that does not contain aluminum.

The second metal layer 44 is located between the first metal layer 42 and the third metal layer 46. The second metal layer 44 in this embodiment makes direct contact with both the first metal layer 42 and the third metal layer 46, however, in another embodiment, other conductive layer(s) may be interposed at least one of between the first metal layer 42 and the second metal layer 44, and between the second metal layer 44 and the third metal layer 46. A metallic material of the second metal layer 44 is titanium nitride (TiN), and it is greater in tensile strength than the metallic material of the first metal layer 42. The metallic material of the second metal layer 44 is not limited to titanium nitride, and it simply needs to be greater in tensile strength than the metallic material of the first metal layer 42. As such a metallic material, for example, titanium (Ti), tungsten (W), molybdenum (Mo), or an alloy containing at least one of the aforementioned elements may be exemplified.

A metallic material of the third metal layer 46 is Al—Si alloy, which is the same metallic material as the first metal layer 42. Thus, the metallic material of the third metal layer 46 is smaller in tensile strength than the metallic material of the second metal layer 44. Similarly to the first metal layer 42, the metallic material of the third metal layer 46 is not limited to Al—Si alloy. The metallic material of the third metal layer 46 simply needs to be smaller in tensile strength than the metallic material of the second metal layer 44, and for example, it may be aluminum or another type of aluminum alloy. As another embodiment, the metallic material of the third metal layer 46 may be a metallic material that is different from the metallic material of the first metal layer 42. Further, to increase affinity with solder, each upper main electrode 14 may further include a nickel layer or other metal layer on top of the third metal layer 46.

As shown in FIGS. 1 and 3, the plurality of signal electrodes 16 is located on the peripheral region Y. The plurality of signal electrodes 16 includes, for example, a gate signal electrode connected to the plurality of gate electrodes 32, a temperature sensing electrode connected to a temperature sensor (not shown) provided in the semiconductor device 10, and a current sensing electrode configured to output fine current for current detection that is proportional to main current (emitter current) flowing in the semiconductor substrate 12. Each of the signal electrodes 16 is an example of a second electrode in the technique disclosed herein, and is designed to be wire-bonded to a conductive member such as a lead.

The signal electrodes 16 are constituted of a metallic material that is the same as each of the metallic materials of the first metal layers 42 and the third metal layers 46 of the upper main electrodes 14. That is, the signal electrodes 16 in this embodiment are constituted of Al—Si alloy. However, the metallic material of the signal electrodes 16 is not limited to Al—Si alloy, and it may, for example, be aluminum or other type of aluminum alloy. As shown in FIG. 3, each signal electrode 16 does not include any high-strength intermediate layer such as the second metal layers 44 in the upper main electrodes 14, and in this regard, it is different from the structure of the upper main electrodes 14. Further, a polysilicon layer 17 is interposed between each signal electrode 16 and the semiconductor substrate 12. The polysilicon layers 17 alleviate propagation of force and vibration caused upon wire bonding to the semiconductor substrate 12. However, the polysilicon layers 17 are not necessarily required in the semiconductor device 10.

A protective film 20 is provided on the upper surface 12a of the semiconductor substrate 12, The protective film 20 is constituted of polyimide. The protective film 20 is primarily provided along a periphery of the semiconductor device 10, and it surrounds the upper main electrodes 14 and the plurality of signal electrodes 16. The protective film 20 is not limited to polyimide, and may be constituted of other type of insulative material.

The lower main electrode 18 is in contact with the lower surface 12b of the semiconductor substrate 12, and makes ohmic contact with the collector region 22. That is, the lower main electrode 18 is electrically connected to the plurality of semiconductor elements 38, and functions as a connection terminal for the power supply circuit. Similarly to the upper main electrodes 14, the lower main electrode 18 is designed to be soldered to a conductive member, such as a lead. In the semiconductor device 10 of the present embodiment, a material and a configuration of the lower main electrode 18 are not particularly limited.

Figure 4:
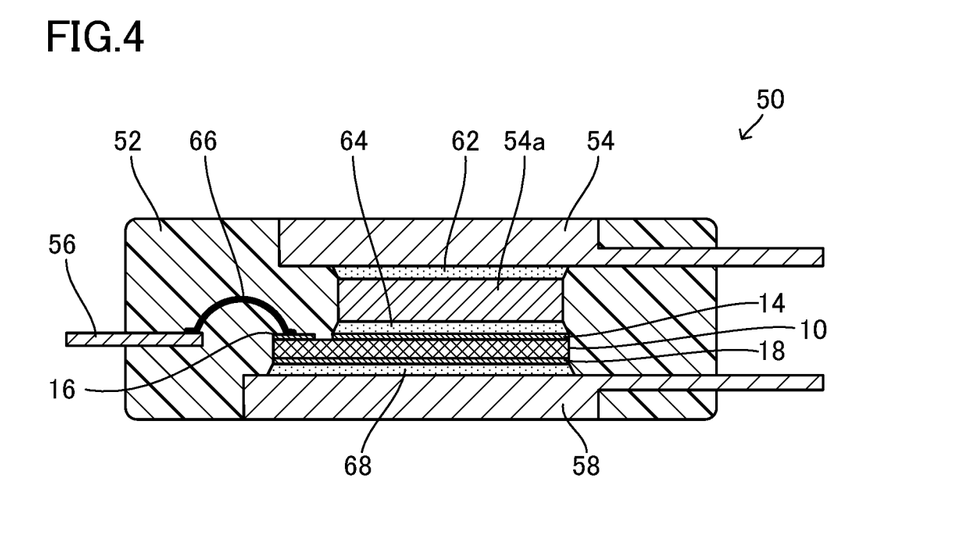
FIG. 4 Shows an example of a semiconductor package 50 including the semiconductor device 10.

FIG. 4 schematically shows a configuration of a semiconductor package 50, which is an application example of the semiconductor device 10. The semiconductor package 50 includes the semiconductor device 10, and a seal body 52 that seals the semiconductor device 10. The seal body 52 is constituted of insulative resin material, and is also called resin mold. The semiconductor package 50 further includes an upper lead 54, a spacer 54a, a plurality of signal leads 56, and a lower lead 58. These members 54, 54a, 56, 58 are constituted of a conductive material such as copper.

The upper lead 54 is electrically connected to the upper main electrodes 14 of the semiconductor device 10 via the spacer 54a. As aforementioned, the upper main electrodes 14 of the semiconductor device 10 are designed to be soldered to conductive member(s). Thus, the upper main electrodes 14 are soldered to the spacers 54a, and solder joint layers 62 are provided between the upper main electrodes 14 and the spacers 54a. Further, the spacer 54a is soldered to an upper lead 54, and a solder joint layer 64 is provided between each spacer 54a and its corresponding upper lead 54. Similarly the lower leads 58 are soldered to the lower main electrode 18 of the semiconductor device 10, and a solder joint layer 68 is provided between the lower main electrode 18 and each lower lead 58.

Figure 5:
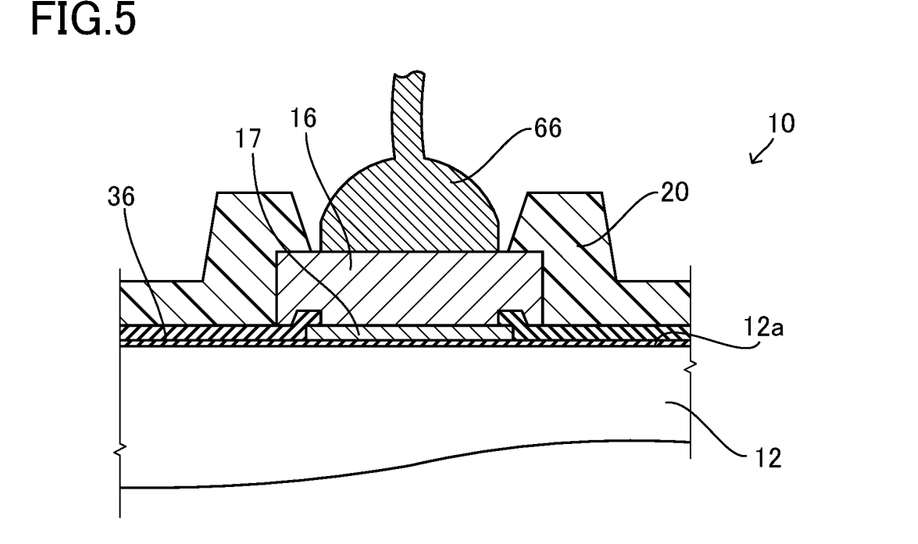
FIG. 5 schematically shows ire bonding to a signal electrode 16 of the embodiment.

The plurality of signal leads 56 is connected respectively to the plurality of signal electrodes 16 of the semiconductor device 10. As aforementioned, each of the signal electrodes 16 of the semiconductor device 10 is designed to be wire-bonded to a conductive member. Thus, as shown in FIG. 5, each signal electrode 16 is connected to its corresponding one of the signal leads 56 via a bonding wire 66. A material of the bonding wires 66 is not particularly limited, and it may, for example, be aluminum or copper. Further, a specific method of the wire bonding is not particularly limited as well, and it may, for example, be ball bonding or wedge bonding.

In the semiconductor device 10 of the present embodiment, each upper main electrode 14 includes the high-strength second metal layer 44 as its intermediate layer. According to such an electrode structure, strength of the upper main electrodes 14 can be increased, and thus failures in the semiconductor device 10 can be prevented. For example, in the upper main electrodes 14 of the semiconductor device 10, high stress is generated locally due to thermal expansion of the semiconductor device 10, which may result in a crack generation in the upper main electrodes 14. Such a crack is likely to occur especially at an inner periphery 18e (see FIG. 2) of the protective film 20. At a stage where only a minor crack has occurred in the upper main electrodes 14, performance of the semiconductor device 10 is hardly affected. However, if this crack grows larger and reaches the semiconductor substrate 12, the semiconductor elements 38 provided within the semiconductor substrate 12 may thereby be damaged. In this case, a serious problem may occur in the performance and operation of the semiconductor device 10. In this regard, when the upper main electrodes 14 are provided with the high-strength second metal layers 44 as their intermediate layers, the growth of the crack in the upper main electrodes 14 can be suppressed, and the crack can be avoided reaching the semiconductor substrate 12.

Figure 6:
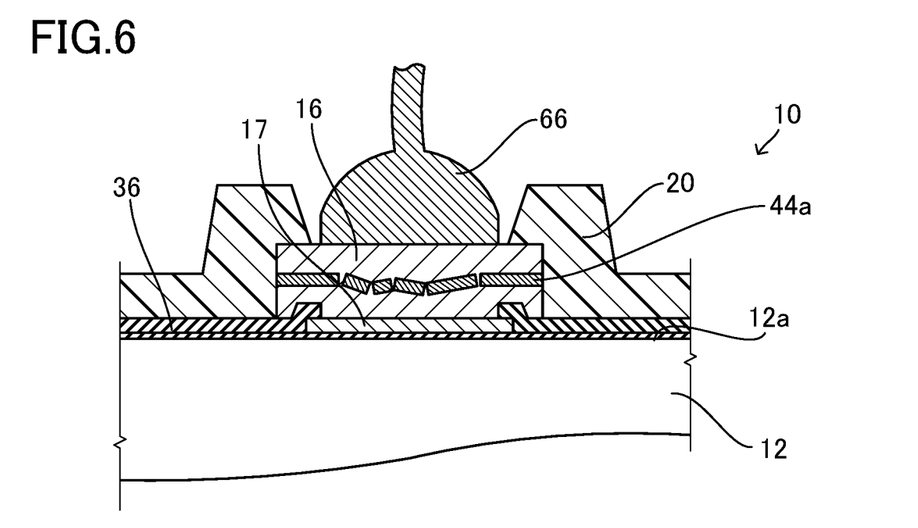

On the other hand, if the signal electrodes 16 are provided with high-strength intermediate layers like the second metal layers 44, the following problem may occur. That is, as shown in FIG. 6, it has been found that when the signal electrodes 16 provided with the high-strength intermediate layers 44a are wire bonded, a crack may occur in the high-strength intermediate layers 44a due to pressure and ultrasonic vibration to which the signal electrodes 16 are subjected. When such a crack occurs in the high-strength intermediate layers 44a, another crack reaching the semiconductor substrate 12 may be generated with the aforementioned crack as its starting point. That is, in the signal electrodes 16 to be wire bonded, the presence of the high-strength intermediate layers 44a can rather be a factor that causes the failure of the semiconductor device 10. As such, in the semiconductor device 10 of the present embodiment, the upper main electrodes 14, which are to be subjected to soldering, are provided with the high-strength second metal layers 44, whereas the signal electrodes 16, which are to be subjected to wire bonding, are not provided with such high-strength intermediate layers 44a.

Figure 7:
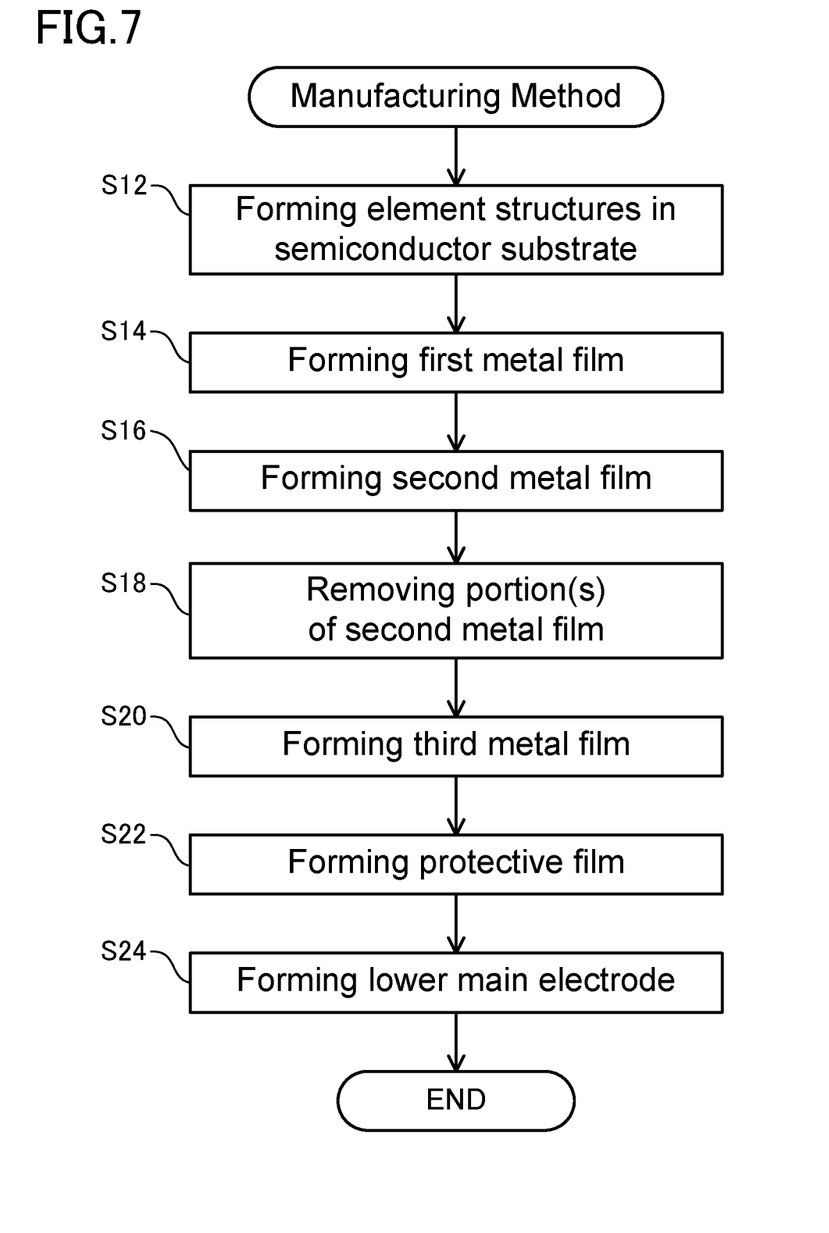
FIG. 7 is a flowchart showing processes of a manufacturing method of the semiconductor device 10.

Next, a manufacturing method of the semiconductor device 10 will be described. In the following description, features unique to the semiconductor device 10 of the present embodiment will mainly be described, and general matters that a person skilled in the art would understand are omitted as needed. FIG. 7 is a flowchart showing the manufacturing method of the semiconductor device 10. In step S12, the structure of the semiconductor elements 38 (see FIG. 1) is formed in the semiconductor substrate 12. Specific methods therefor are well known, so description thereof will be omitted.

Figure 8A:
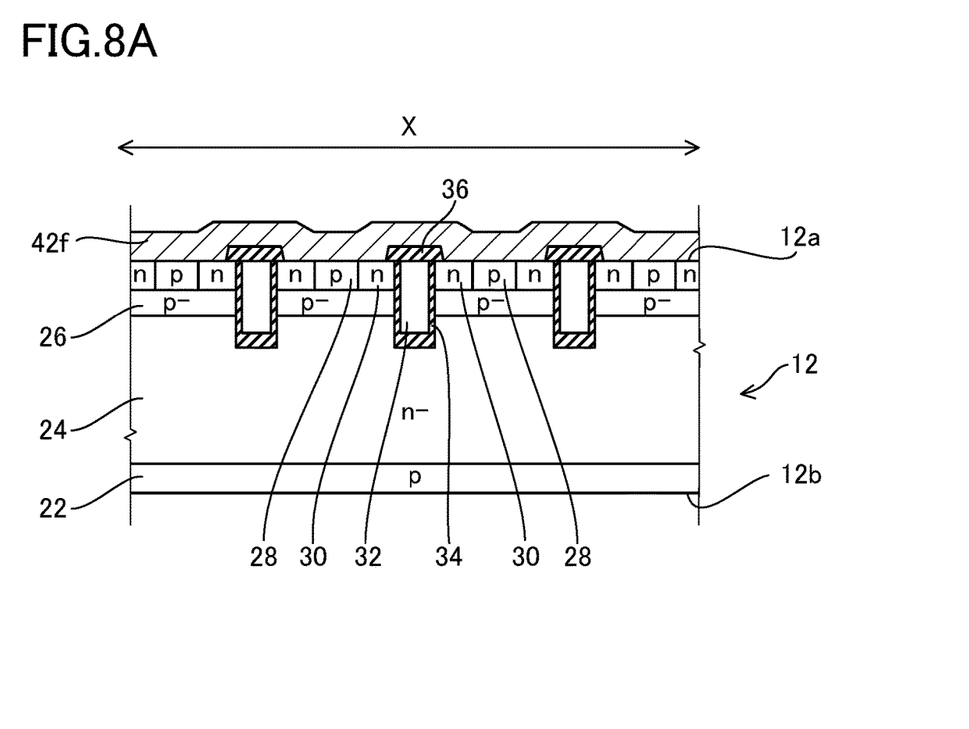
FIG. 8A schematically shows formation of a first metal film 42f (element region X).
Figure 8B:
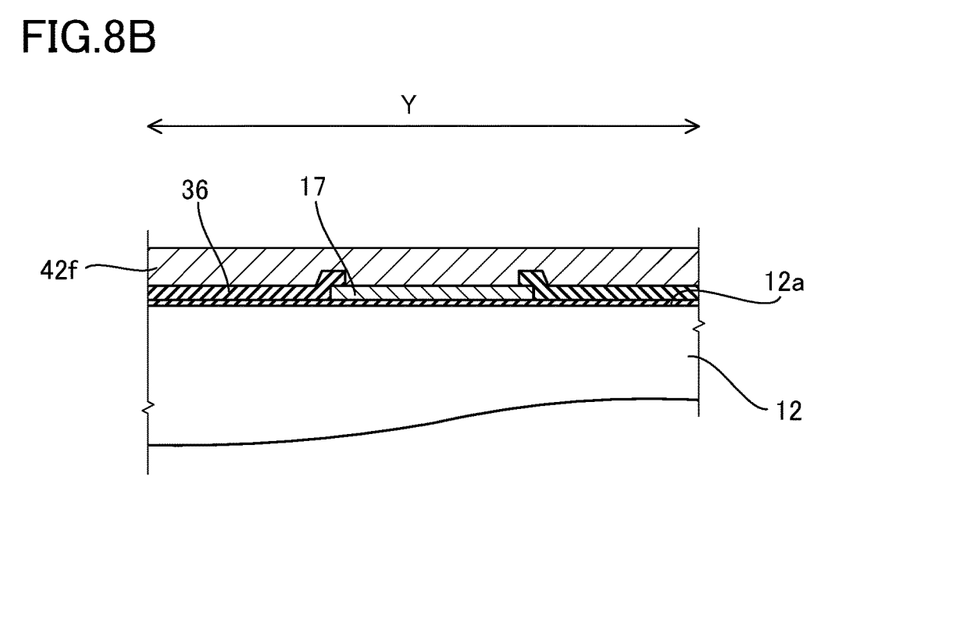
FIG. 8B schematically shows the formation of the first metal film 42f (peripheral region Y).

Next, in step S14, as shown in FIGS. 8A and 8B, a first metal film 42f is formed on the upper surface 12a of the semiconductor substrate 12. The first metal film 42f is formed on both the element region X and the peripheral region Y. The element region X is an example of a first area where the first electrode is to be provided in the technique disclosed herein, and the peripheral region Y is an example of a second area where the second electrode is to be provided in the technique disclosed herein. The first metal film 42f is to become the first metal layers 42 of the upper main electrodes 14 and a part of the signal electrodes 16, and it is constituted of the metallic material of the first metal layers 42 (for example, Al—Si alloy). Although not particularly limited, the first metal film 42f may be formed by sputtering.

Figure 9A:
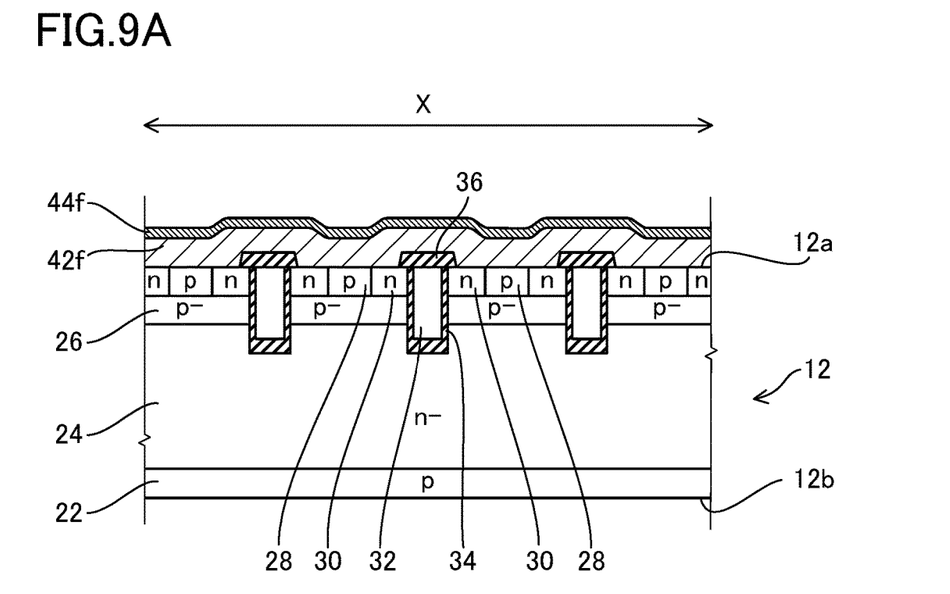
FIG. 9A schematically shows formation of a second metal film 44f (element region X).
Figure 9B:
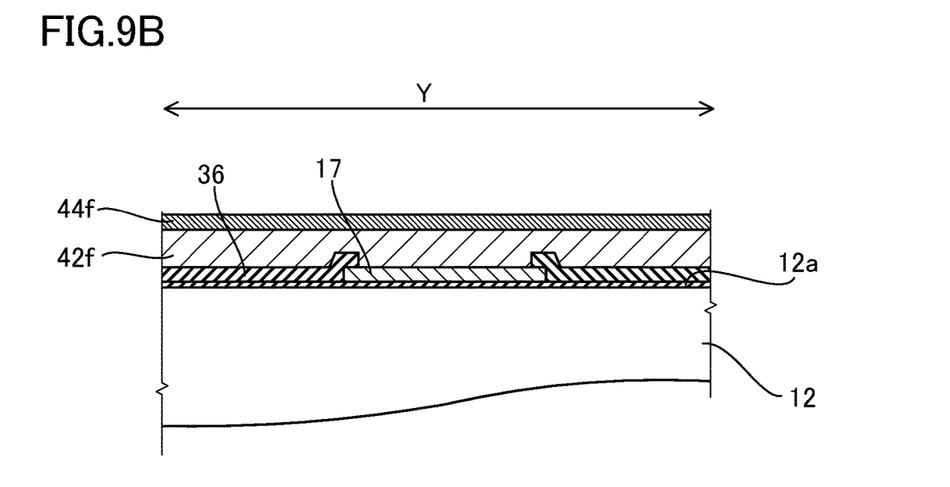
FIG. 9B schematically shows the formation of the second metal film 44f (peripheral region Y).

Next, in step S16, as shown in FIGS. 9A and 9B, a second metal film 44f is formed on a surface of the first metal film 42f. The second metal film 44f is to become the second metal layers 44 of the upper main electrodes 14, and is constituted of the metallic material of the second metal layers 44 (for example, titanium nitride). That is, the metallic material of the second metal film 44f is greater in tensile strength than the metallic material of the first metal film 42f. At this stage, the second metal film 44f is formed not only on the element region X where the upper main electrodes 14 are to be formed, but also on the peripheral region Y where the plurality of signal electrodes 16 is to be formed. Although not particularly limited, the second metal film 44f may be formed by sputtering.

Figure 10A:
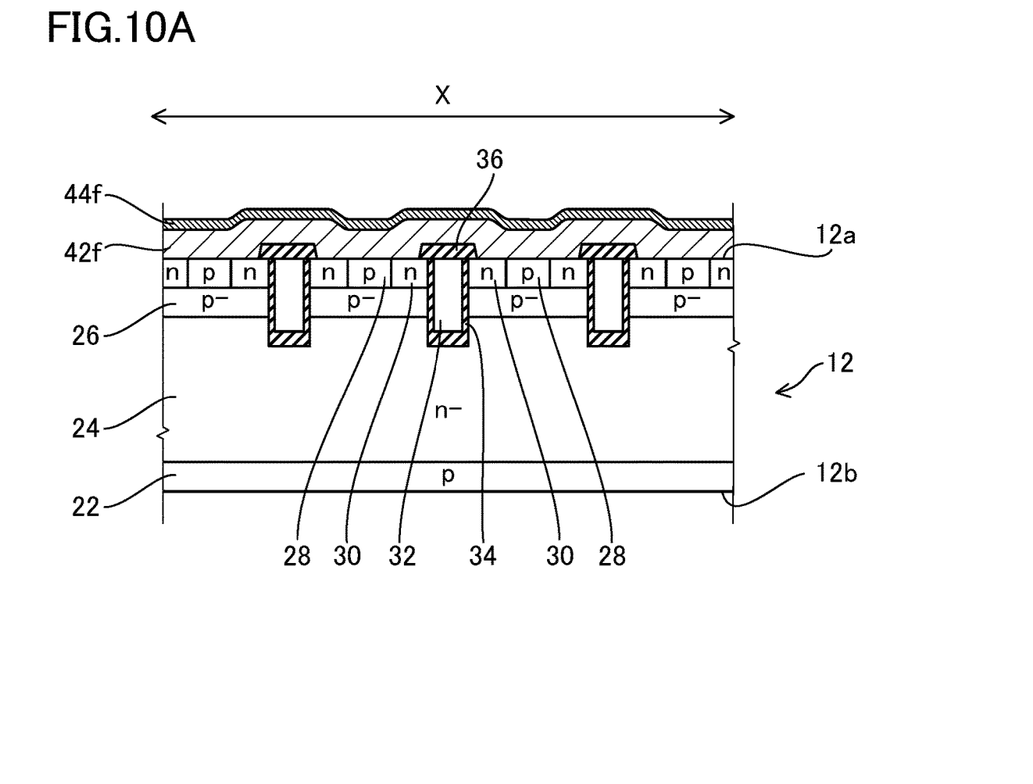
FIG. 10A schematically shows removal of the second metal film 44f (element region X).
Figure 10B:
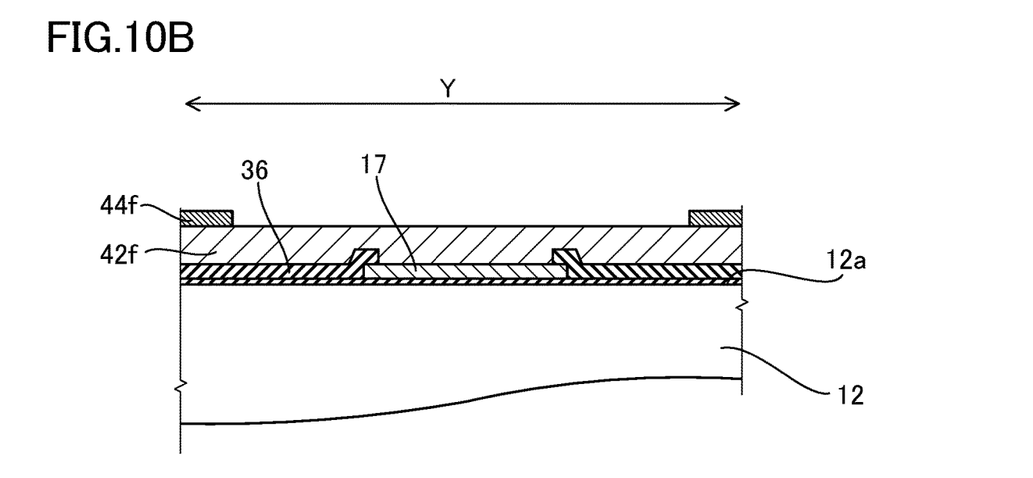
FIG. 10B schematically shows the removal of the second metal film 44f (peripheral region Y).

Next, in step S18, as shown in FIGS. 10A and 10B, only a portion of the second metal film 44f formed on the peripheral region Y in step S16 is removed. Not entirety of the second metal film 44f on the peripheral region Y needs to be removed. The second metal film 44f simply needs to be removed at least from areas where the plurality of signal electrodes 16 is to be formed. Although not particularly limited, this partial removal of the second metal film 44f may be performed by wet etching or dry etching using an appropriate mask.

Figure 11A:
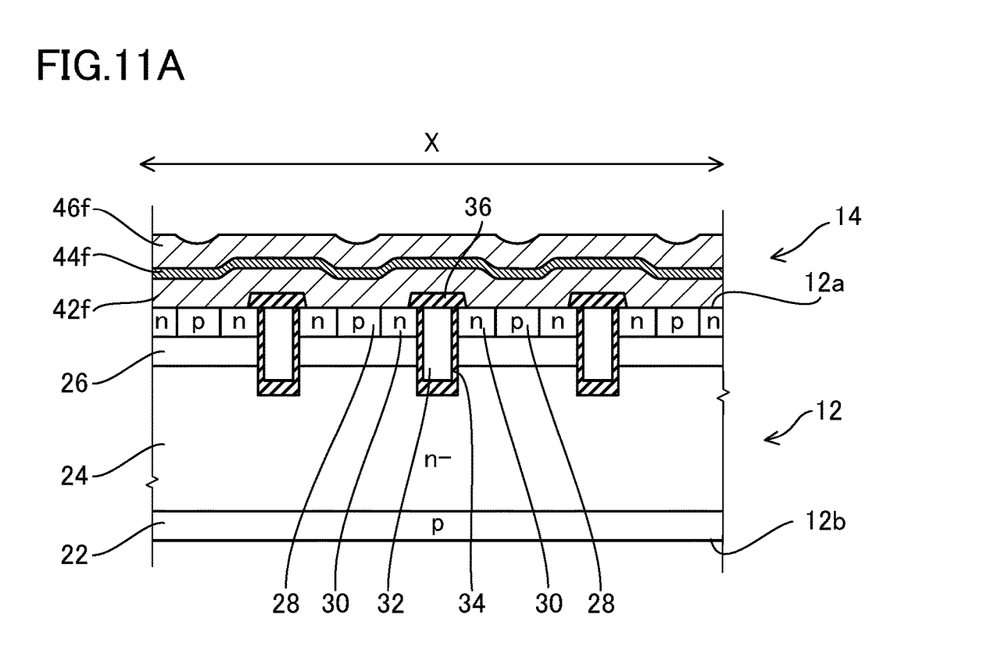
FIG. 11A schematically shows formation of a third metal film 46f (element region X).
Figure 11B:
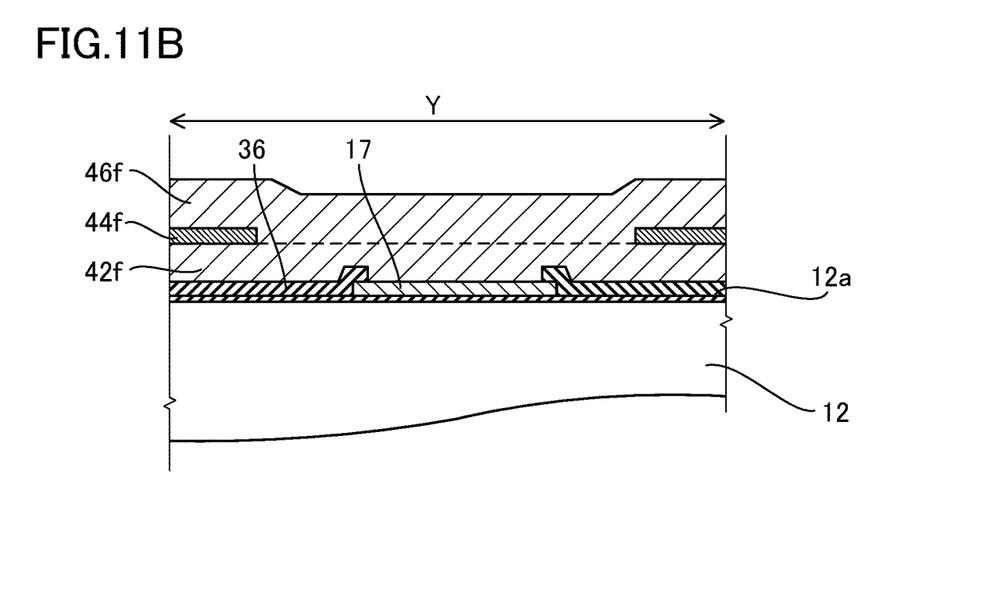
FIG. 11B schematically shows the formation of the third metal film 46f (peripheral region Y).

Next, in step S20, as shown in FIGS. 11A, and 11B, a third metal film 46f is formed on a surface of the second metal film 44f. The third metal film 46f is to become the third metal layers 46 of the upper main electrodes 14 and a part of the signal electrodes 16, and is constituted of the metallic material of the third metal layers 46 (for example, Al—Si alloy). The third metal film 46f is formed on both the element region X and the peripheral region Y. The third metal film 46f is formed on the surface of the second metal film 44f in the element region X, but in the peripheral region Y (especially in the areas where the signal electrodes 16 are to be formed), the third metal film 46f is formed directly on the surface of the first metal film 42f. Although not particularly limited, the third metal film 46f may be formed by sputtering.

Figure 12A:
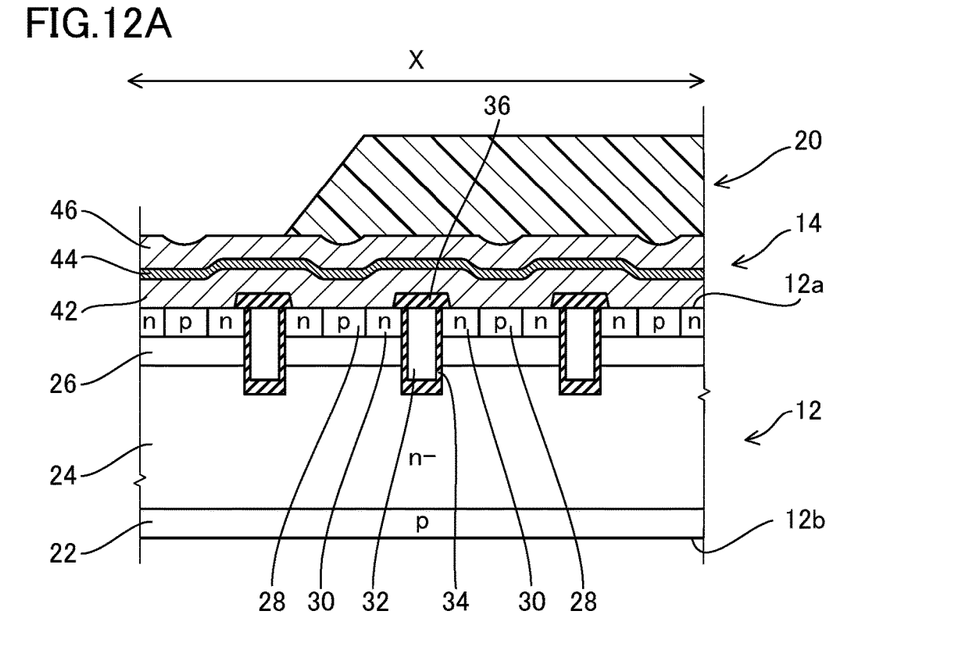
FIG. 12A schematically shows formation of a protective film 20 (element region X).
Figure 12B:
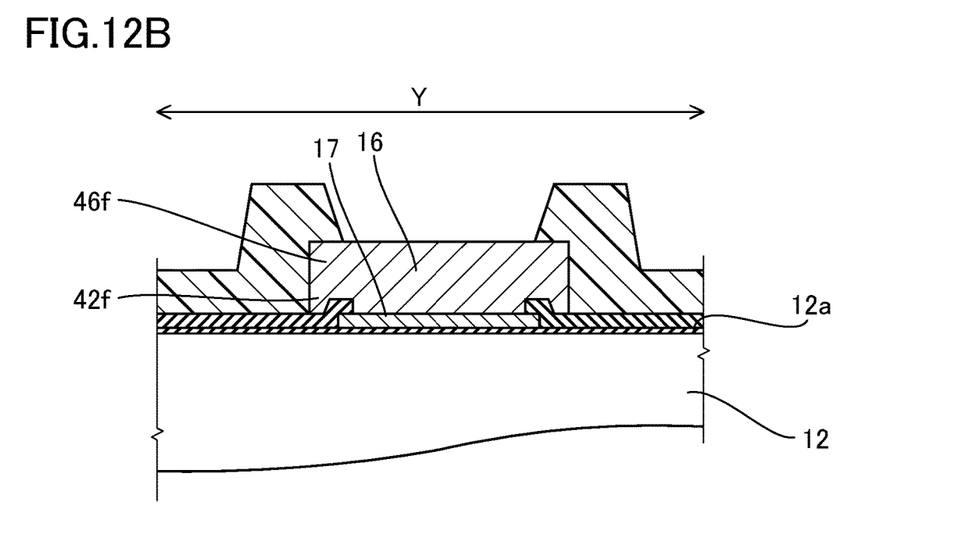
FIG. 12B schematically shows the formation of the protective film 20 (peripheral region Y).

Next, in step S22, as shown in FIGS. 12A and 12B, the protective film 20 is formed on the upper surface 12a of the semiconductor substrate 12 after the upper main electrodes 14 and the plurality of signal electrodes 16 have been patterned. As aforementioned, the protective film 20 is constituted of the insulative material such as polyimide. In the formation of the protective film 20, although not particularly limited, the upper main electrodes 14 and the plurality of signal electrodes 16 may be exposed by wet etching after the polyimide film has been entirely formed. Next, in step S24, the lower main electrode 18 is formed on the lower surface 121, of the semiconductor substrate 12. Although not particularly limited, the lower main electrode 18 may be formed by sputtering.

The semiconductor device 10 is manufactured as above, or with a few more additional processes. According to the aforementioned manufacturing method, the upper main electrodes 14 including the high-strength second metal layers 44 as well as the signal electrodes 16 not including the intermediate layers such as the second metal layers 44 can be simultaneously formed on the upper surface 12a of the semiconductor substrate 12. Due to this, the semiconductor device 10 can relatively easily he manufactured.

What is claimed is:

1. A semiconductor device comprising:
   a semiconductor substrate;
   a first electrode disposed on a surface of the semiconductor device and configured to be soldered to a conductive member; and
   a second electrode disposed on the surface of the semiconductor device and configured to be wire-bonded to a conductive member,
   wherein
   the first electrode comprises a first metal layer, a second metal layer, and a third metal layer, the second metal layer being located between the first metal layer and the third metal layer, and a metallic material of the second metal layer being greater in tensile strength than a metallic material of each one of the first metal layer and the third metal layer, and
   the second electrode comprises a layer constituted of a same metallic material as one of the first metal layer and the third metal layer, and does not comprise any layers constituted of a same metallic material as the second metal layer.

2. The semiconductor device according to claim 1, wherein
   the semiconductor substrate comprises an element region in which at least one semiconductor element is provided and a peripheral region located around the element region, and
   the first electrode is located on the element region and the second electrode is located on the peripheral region.

3. The semiconductor device according to claim 1, wherein the second electrode is constituted only of the same metallic material as the first metal layer and the third metal layer, and does not include any intermediate layers constituted of other metallic material.

4. The semiconductor device according to claim 1, wherein the first metal layer and the third metal layer are constituted of the same metallic material as each other.

5. The semiconductor device according to claim 1, wherein the second metal layer is constituted of titanium nitride.

6. A method of manufacturing a semiconductor device that comprises: a semiconductor substrate; a first electrode disposed on a surface of the semiconductor device and configured to be soldered to a conductive member; and a second electrode disposed on the surface of the semiconductor device and configured to be wire-bonded to a conductive member, the method comprising:
   forming a first metal film on the surface of the semiconductor substrate, the first metal film being formed both on a first area where the first electrode is to be formed and on a second area where the second electrode is to be formed;
   forming a second metal film on a surface of the first metal film, the second metal film being formed both in the first area and in the second area, and a metallic material of the second metal film being greater in tensile strength than a metallic material of the first metal film;
   removing a portion of the second metal film located within the second area; and
   forming a third metal film on a surface of the second metal film, the third metal film being formed both in the first area and in the second area, the third metal film being formed directly on the surface of the first metal film in the second area, and a metallic material of the third metal film being lower in tensile strength than the metallic material of the second metal film.

* * * * *